(12) United States Patent
Matsuo et al.

(10) Patent No.: US 11,369,022 B2
(45) Date of Patent: Jun. 21, 2022

(54) ELECTRONIC DEVICE AND ELECTRICALLY INSULATING MEMBER THEREFOR

(71) Applicant: Mitsubishi Electric Corporation, Tokyo (JP)

(72) Inventors: Haruyuki Matsuo, Tokyo (JP); Keiji Sakimoto, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/918,132

(22) Filed: Jul. 1, 2020

(65) Prior Publication Data

US 2021/0204407 A1    Jul. 1, 2021

(30) Foreign Application Priority Data

Dec. 26, 2019    (JP) .............................. JP2019-236086

(51) Int. Cl.
*H05K 1/18*    (2006.01)
*H05K 7/14*    (2006.01)

(52) U.S. Cl.
CPC ........... *H05K 1/181* (2013.01); *H05K 7/1427* (2013.01); *H05K 2201/0753* (2013.01); *H05K 2201/09818* (2013.01); *H05K 2201/10757* (2013.01)

(58) Field of Classification Search
CPC .... H05K 1/18; H05K 1/181–187; H05K 7/20; H05K 7/1427; H05K 2201/09; H05K 2201/09818; H05K 2201/0753; H05K 2201/10757; H01L 23/02; H01L 25/072; H01L 25/162

USPC ......... 361/752–759, 775–778, 803; 439/76.2
See application file for complete search history.

(56) References Cited

U.S. PATENT DOCUMENTS

| | | | | |
|---|---|---|---|---|
| 4,218,724 A | * | 8/1980 | Kaufman | H05K 5/0091 |
| | | | | 361/752 |
| 5,471,089 A | * | 11/1995 | Nagatomo | H01L 23/50 |
| | | | | 257/691 |
| 5,635,536 A | * | 6/1997 | Lyons | A61K 9/1075 |
| | | | | 514/937 |

(Continued)

FOREIGN PATENT DOCUMENTS

| JP | 2007-220963 A | 8/2007 |
|---|---|---|
| JP | 2009-302402 A | 12/2009 |
| JP | 6380044 B2 | 8/2018 |

OTHER PUBLICATIONS

Notice of Reasons for Refusal dated Mar. 3, 2021 from the Japanese Patent Office in JP application No. 2019-236086.

*Primary Examiner* — Tuan T Dinh
(74) *Attorney, Agent, or Firm* — Sughrue Mion, PLLC; Richard C. Turner

(57) ABSTRACT

An electronic device includes a circuit board, an electronic component, and an insulating member. The electronic component includes: a component main body that faces the circuit board; and a first lead terminal that is connected to the circuit board. The insulating member includes a base portion, a mounting portion, and an insulating wall. The mounting portion is disposed on the base portion, and is mounted to the circuit board. The insulating wall protrudes from the base portion, and is disposed between the first lead terminal and a conductive member that is positioned so as to be adjacent to the first lead terminal.

8 Claims, 10 Drawing Sheets

(56) References Cited

U.S. PATENT DOCUMENTS

| | | | | | |
|---|---|---|---|---|---|
| 5,751,058 | A | * | 5/1998 | Matsuki | H01L 25/072 257/678 |
| 5,942,797 | A | * | 8/1999 | Terasawa | H01L 25/162 257/723 |
| 6,163,460 | A | * | 12/2000 | Baur | H01G 2/04 361/752 |
| 6,421,244 | B1 | * | 7/2002 | Shinohara | H01L 25/162 361/736 |
| 7,208,833 | B2 | * | 4/2007 | Nobori | H01L 24/33 257/704 |
| 7,663,886 | B2 | * | 2/2010 | Aoki | H01L 25/162 361/715 |
| 7,679,923 | B2 | * | 3/2010 | Inagaki | H05K 5/061 361/752 |
| 8,107,255 | B2 | * | 1/2012 | Sakamoto | H05K 5/065 361/792 |
| 8,169,784 | B2 | * | 5/2012 | Sakamoto | H01L 25/162 361/729 |
| 9,414,532 | B2 | * | 8/2016 | Roche | H05K 7/2089 |
| 2016/0183405 | A1 | * | 6/2016 | Sanada | H01L 23/433 361/694 |

* cited by examiner

ELECTRONIC DEVICE AND ELECTRICALLY INSULATING MEMBER THEREFOR

BACKGROUND OF THE INVENTION

1. Field of the Invention

The present disclosure relates to an electronic device and an insulating member therefor.

2. Description of the Related Art

A conventional electronic device includes a circuit board, a component, and a terminal aligning member. A plurality of through-holes are disposed on the circuit board. The component has a main body portion and a plurality of lead terminals. The terminal aligning member is disposed between the main body portion and the circuit board. A plurality of aligning apertures are disposed on the terminal aligning member. During assembly of the electronic device, the plurality of lead terminals are aligned by the plurality of aligning apertures (see Japanese Patent No. 6380044 (Gazette), for example).

SUMMARY OF THE INVENTION

In conventional electronic device such as that described above, when a high voltage is applied to each of the lead terminals, there is a risk that leakage current may arise between adjacent lead terminals.

The present disclosure aims to solve the above problems and an object of the present invention is to provide an electronic device, and an insulating member therefor, in which the occurrence of leakage currents can be suppressed.

An electronic device according to the present invention includes: a circuit board; an electronic component including: a component main body that faces the circuit board; and a first lead terminal that is connected to the circuit board; and an insulating member that is mounted to the circuit board, wherein: the insulating member includes: a base portion; a mounting portion that is disposed on the base portion, the mounting portion being mounted to the circuit board; and an insulating wall that protrudes from the base portion, the insulating wall being disposed between the first lead terminal and a conductive member that is positioned so as to be adjacent to the first lead terminal.

According to the electronic device and the electrically insulating member therefor according to the present disclosure, the occurrence of leakage currents can be suppressed.

DESCRIPTION OF THE PREFERRED EMBODIMENTS

Preferred embodiments will now be explained with reference to the drawings.

Embodiment 1

Figure 1:
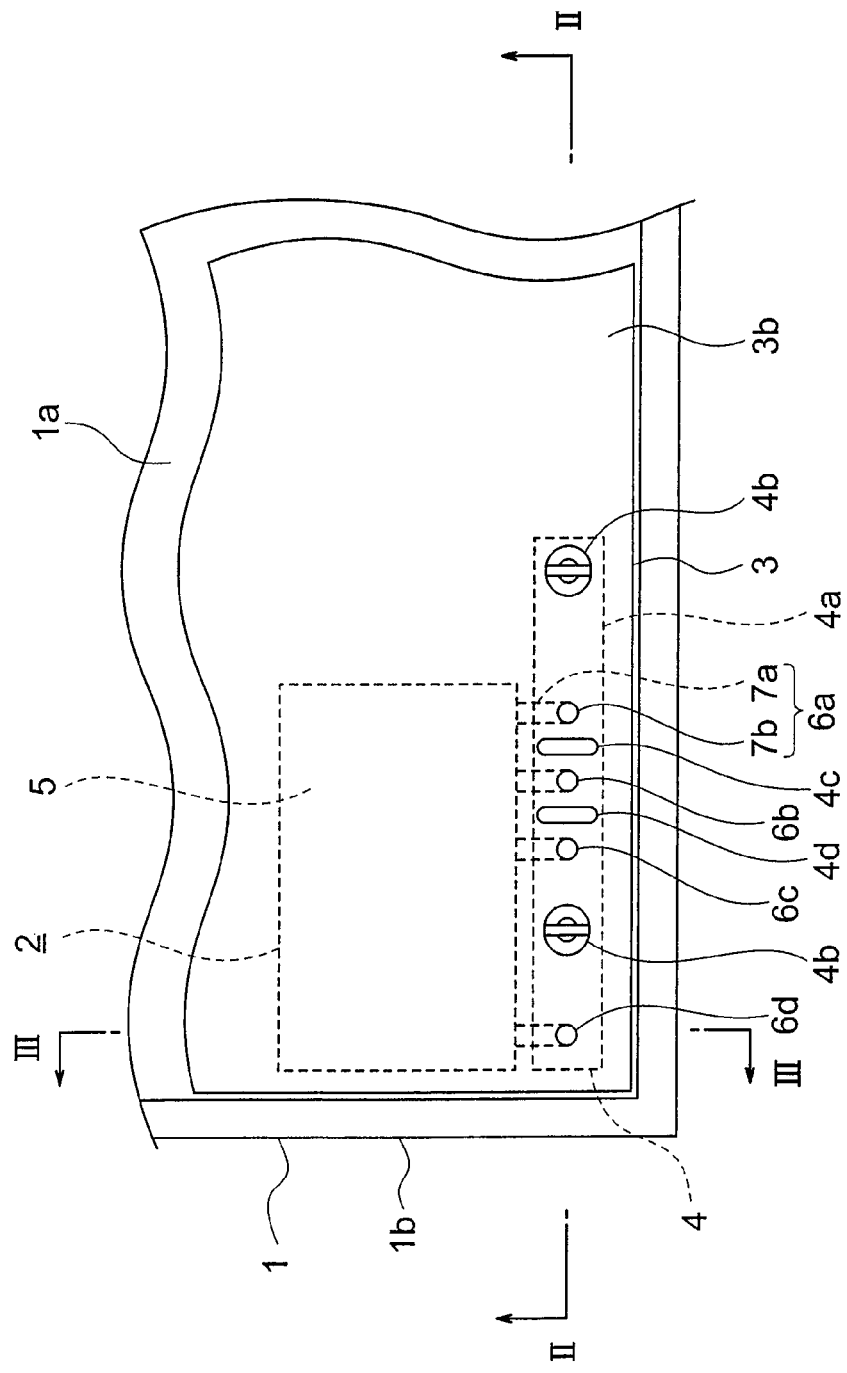
FIG. 1 is a plan that shows part of an electronic device according to Embodiment 1.
Figure 2:
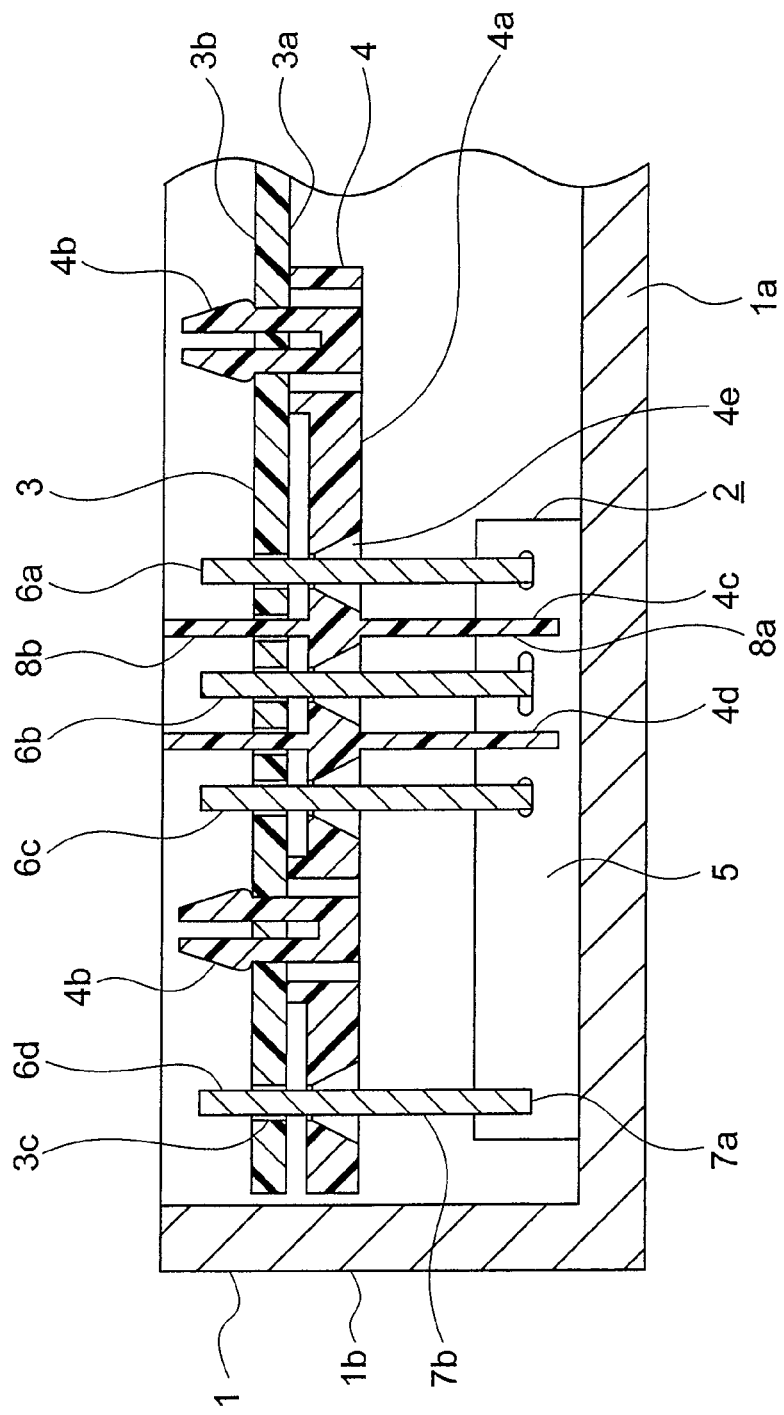
FIG. 2 is a cross section that is taken along Line II-II in FIG. 1.
Figure 3:
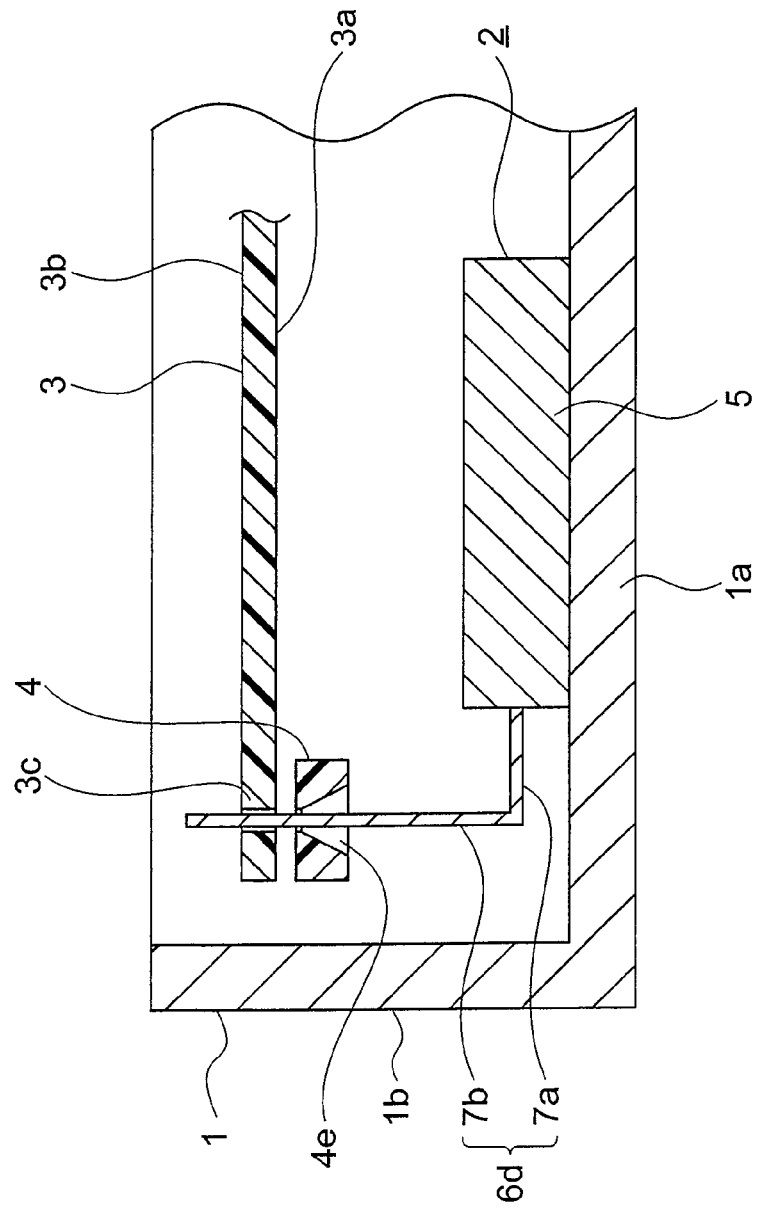
FIG. 3 is a cross section that is taken along Line III-III in FIG. 1.

FIG. 1 is a plan that shows part of an electronic device according to Embodiment 1. FIG. 2 is a cross section that is taken along Line II-II in FIG. 1. FIG. 3 is a cross section that is taken along Line III-III in FIG. 1.

In the figures, an electronic device includes a metal housing 1, an electronic component 2, a circuit board 3, and a resin insulating member 4. The electronic component 2, the circuit board 3, and the insulating member 4 are accommodated in the housing 1.

The housing 1 is manufactured by aluminum die casting, for example. The housing 1 includes a bottom plate portion 1a, and a side wall portion 1b. The side wall portion 1b protrude perpendicular to the bottom plate portion 1a from an edge portion of the bottom plate portion 1a.

The electronic component 2 includes a component main body 5 and a plurality of lead terminals 6a, 6b, 6c, and 6d. The component main body 5 is fixed to the bottom plate portion 1a by a screw or a leaf spring, for example. In FIG. 3, an internal construction of the component main body 5 is omitted.

A shape of each of the plurality of lead terminals 6a, 6b, 6c, and 6d is an L shape. Each of the plurality of lead terminals 6a, 6b, 6c, and 6d includes a leader portion 7a and an extended portion 7b. Each of the leader portions 7a protrudes parallel to the circuit board 3 from a side surface of the component main body 5. The respective extended portions 7b protrude toward the circuit board 3 from the tips of the leader portions 7a.

The circuit board 3 is fixed inside the housing 1 so as to be parallel to the bottom plate portion 1a. The circuit board 3 includes a first surface 3a and a second surface 3b. The component main body 5 faces the first surface 3a. In other words, the first surface 3a is a facing surface that faces the component main body 5. The bottom plate portion 1a faces the first surface 3a. The second surface 3b is a surface on an opposite side from the first surface 3a.

A plurality of through-holes 3c are disposed on the circuit board 3. Each of the extended portions 7b passes through a corresponding through-hole 3c. Each of the extended portions 7b is connected to the circuit board 3 in the corresponding through-hole 3c.

The insulating member 4 is mounted to the circuit board 3. The insulating member 4 includes: a flat base portion 4a; a plurality of mounting portions 4b; a flat first lead interval insulating wall 4c that functions as an insulating wall; and a flat second lead interval insulating wall 4d that functions as an insulating wall. The base portion 4a, the plurality of mounting portions 4b, the first lead interval insulating wall 4c, and the second lead interval insulating wall 4d are formed integrally using a resin.

The base portion 4a is disposed in a space that is adjacent to the first surface 3a. The base portion 4a faces the first surface 3a.

The plurality of mounting portions 4b are disposed on the base portion 4a. The plurality of mounting portions 4b are mounted to the circuit board 3. In other words, the base portion 4a is mounted to the circuit board 3 using the plurality of mounting portions 4b. A snap fitting is used for each of the mounting portions 4b.

As shown in FIG. 1, when viewed along a direction that is perpendicular to the first surface 3a and the second surface 3b, the base portion 4a does not overlap with the component main body 5, and is separated from the component main body 5.

The first lead interval insulating wall 4c and the second lead interval insulating wall 4d each protrude from the base portion 4a so as to be perpendicular to the base portion 4a.

The first lead interval insulating wall 4c is disposed between the lead terminal 6a and the lead terminal 6b. The first lead interval insulating wall 4c increases electrical insulation between the lead terminal 6a and the lead terminal 6b.

The second lead interval insulating wall 4d is disposed between the lead terminal 6b and the lead terminal 6c. The second lead interval insulating wall 4d increases electrical insulation between the lead terminal 6b and the lead terminal 6c.

The lead terminals 6a, 6b, and 6c are each first lead terminals according to Embodiment 1. From the viewpoint of the lead terminal 6a, which functions as a first lead terminal, the lead terminal 6b is a second lead terminal that functions as an electrically conductive member that is positioned adjacent to the lead terminal 6a.

From the viewpoint of the lead terminal 6b, which functions as a first lead terminal, each of the lead terminals 6a and 6c is a second lead terminal that functions an electrically conductive member that is positioned adjacent to the lead terminal 6b. From the viewpoint of the lead terminal 6c, which functions as a first lead terminal, the lead terminal 6b is a second lead terminal that functions as an electrically conductive member that is positioned adjacent to the lead terminal 6c.

The first lead interval insulating wall 4c and the second lead interval insulating wall 4d each include a flat first portion 8a, and a flat second portion 8b. Each of the first portions 8a protrudes from the base portion 4a on an opposite side from the circuit board 3.

Each of the second portions 8b protrudes from the base portion 4a toward the circuit board 3 so as to be aligned with each of the first portions 8a. Each of the second portions 8b passes through the circuit board 3.

An end portion of each of the first portions 8a at an opposite end from the base portion 4a is positioned closer to the bottom plate portion 1a than each of the leader portions 7a. The amount of protrusion of each of the second portions 8b from the second surface 3b is greater than the amount of protrusion of each of the extended portions 7b from the second surface 3b.

A plurality of guiding apertures 4e are disposed on the base portion 4a. One of the plurality of lead terminals 6a, 6b, 6c, and 6d passes through each of the guiding apertures 4e. The plurality of guiding apertures 4e guide the plurality of lead terminals 6a, 6b, 6c, and 6d during mounting of the electronic component 2 to the circuit board 3.

The diameter of each of the guiding apertures 4e decreases continuously from an opening on an opposite side from the circuit board 3 toward an opening on a side near the circuit board 3. The openings of each of the guiding apertures 4e on the side near the circuit board 3 face the corresponding through-holes 3c.

Figure 4:
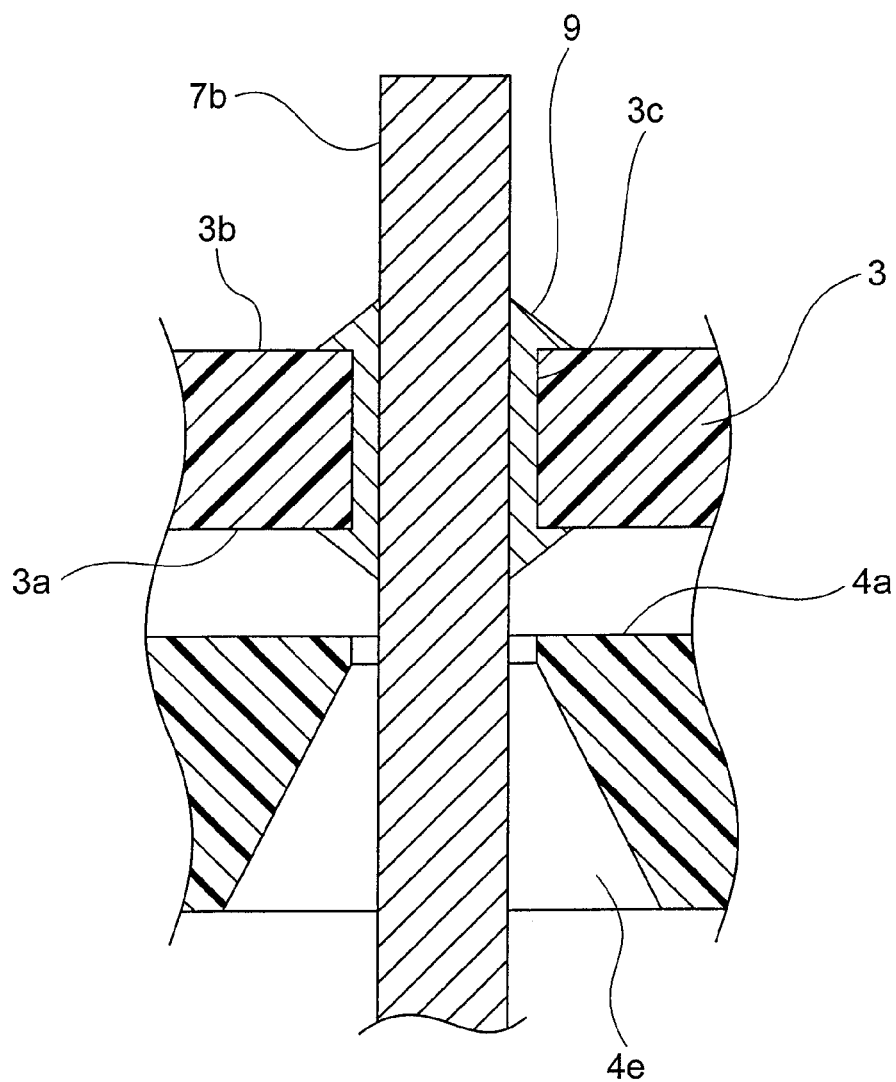
FIG. 4 is a cross section that shows part of FIG. 2 enlarged.

FIG. 4 is a cross section that shows part of FIG. 2 enlarged. The respective extended portions 7b are fixed to the through-holes 3c by means of a solder 9.

In an electronic device and insulating member 4 of this kind, a first lead interval insulating wall 4c is disposed between a lead terminal 6a and a lead terminal 6b. Because of that, the occurrence of leakage currents between the lead terminal 6a and the lead terminal 6b can be suppressed.

A second lead interval insulating wall 4d is disposed between the lead terminal 6b and a lead terminal 6c. Because of that, the occurrence of leakage currents between the lead terminal 6b and the lead terminal 6c can be suppressed.

A base portion 4a is disposed in a space that is adjacent to a first surface 3a. Because of that, the base portion 4a is disposed efficiently, enabling dimensional increases of the electronic device a direction that is perpendicular to the circuit board 3 to be suppressed.

The first lead interval insulating wall 4c and the second lead interval insulating wall 4d both include a first portion 8a. Because of that, the occurrence of leakage currents can be suppressed on an opposite side of the base portion 4a from the circuit board 3.

The first lead interval insulating wall 4c and the second lead interval insulating wall 4d both include a second portion 8b. Because of that, the occurrence of leakage currents can be suppressed on a side of the base portion 4a near the circuit board 3.

A plurality of guiding apertures 4e are disposed on the base portion 4a. In other words, the insulating member 4 also serves as a guiding member for the plurality of lead terminals 6a, 6b, 6c, and 6d. Because of that, increases in the number of components can be suppressed while suppressing the occurrence of leakage currents. The first lead interval insulating wall 4c and the second lead interval insulating wall 4d can also be easily disposed at more appropriate positions relative to the lead terminals 6a, 6b, and 6c.

An end portion of each of the first portions 8a at an opposite end from the base portion 4a is positioned closer to the bottom plate portion 1a than each of the leader portions 7a. Because of that, the occurrence of leakage currents can be suppressed even more extensively.

The amount of protrusion of each of the second portions 8b from the second surface 3b is greater than the amount of protrusion of each of the extended portions 7b from the second surface 3b. Because of that, the occurrence of leakage currents can be suppressed even more extensively.

Embodiment 2

Figure 5:
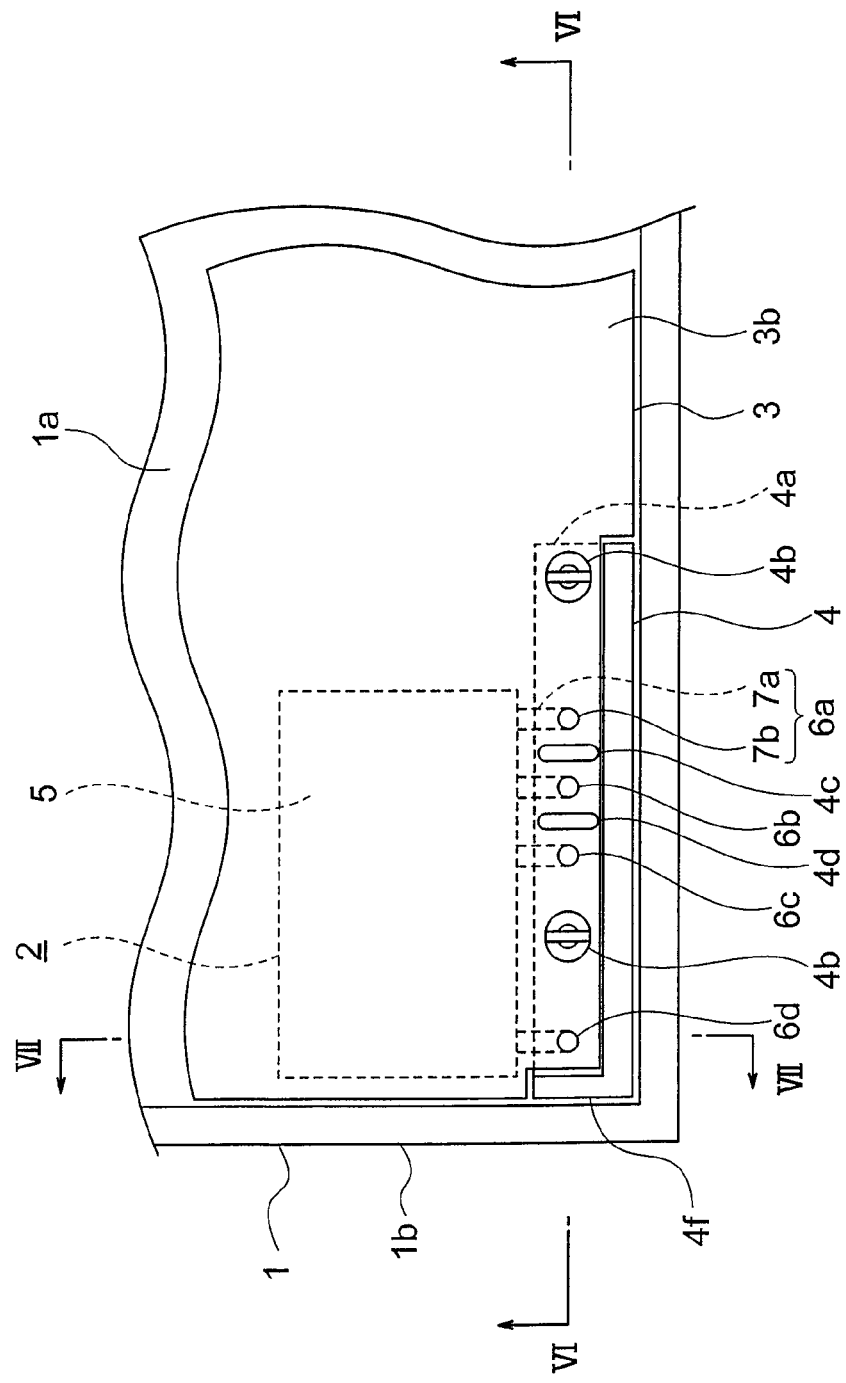
FIG. 5 is a plan that shows part of an electronic device according to Embodiment 2.
Figure 6:
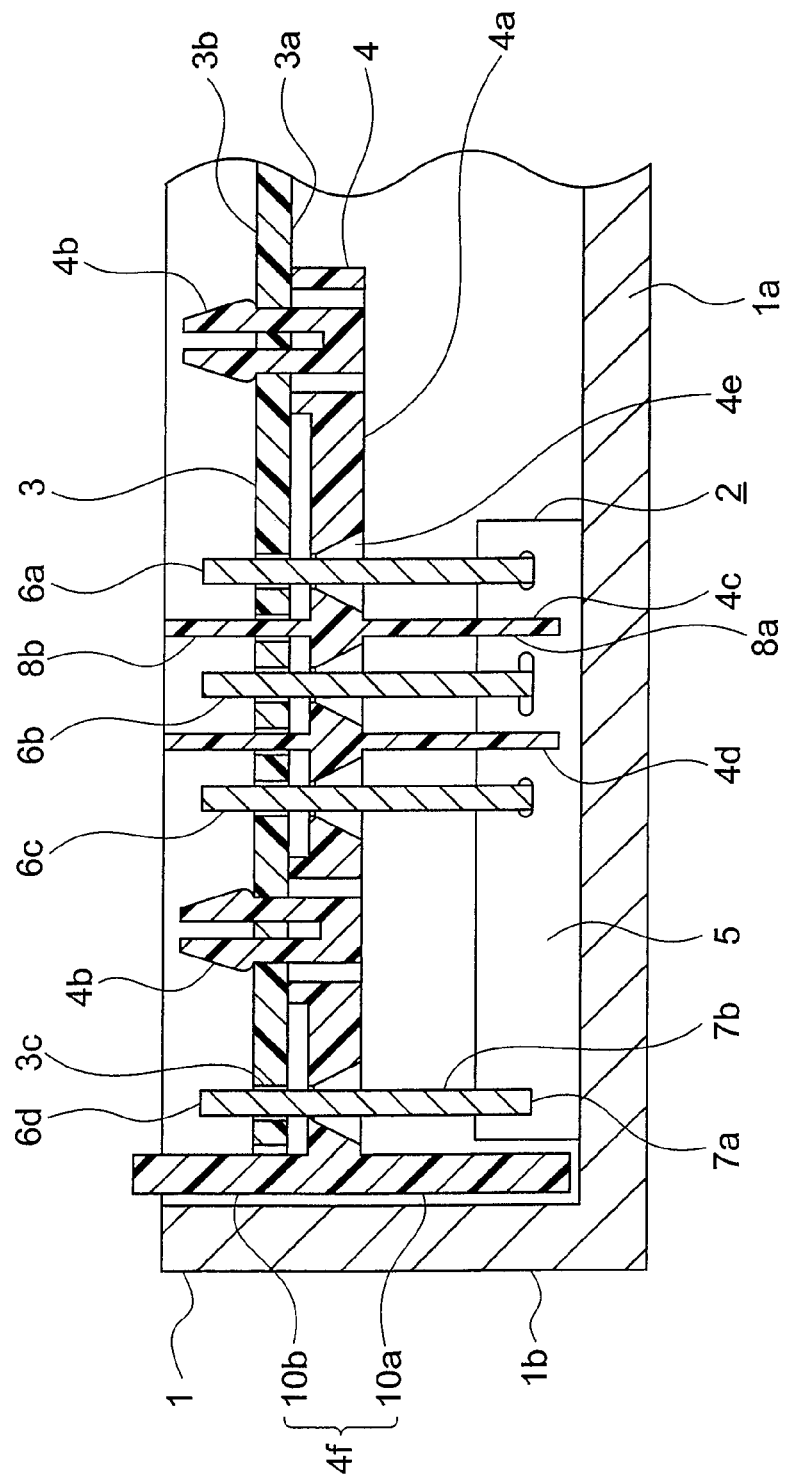
FIG. 6 is a cross section that is taken along Line VI-VI in FIG. 5.
Figure 7:
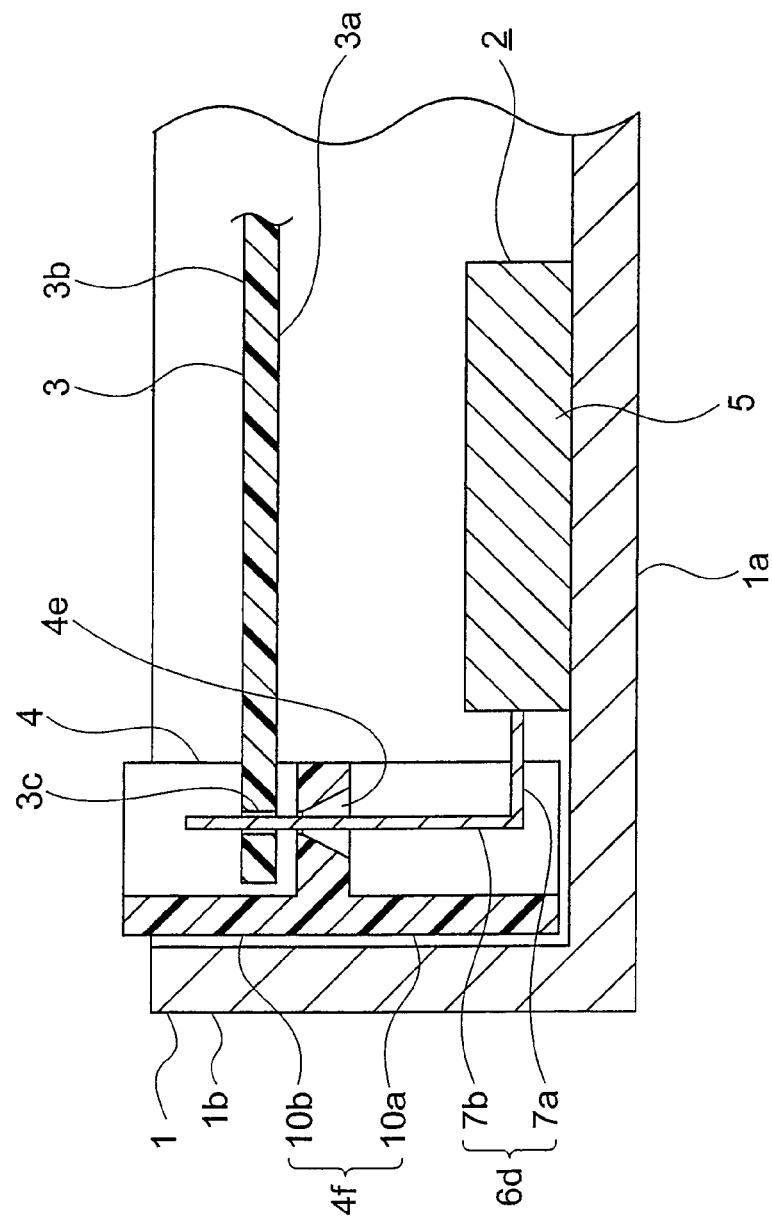
FIG. 7 is a cross section that is taken along Line VII-VII in FIG. 5.
Figure 8:
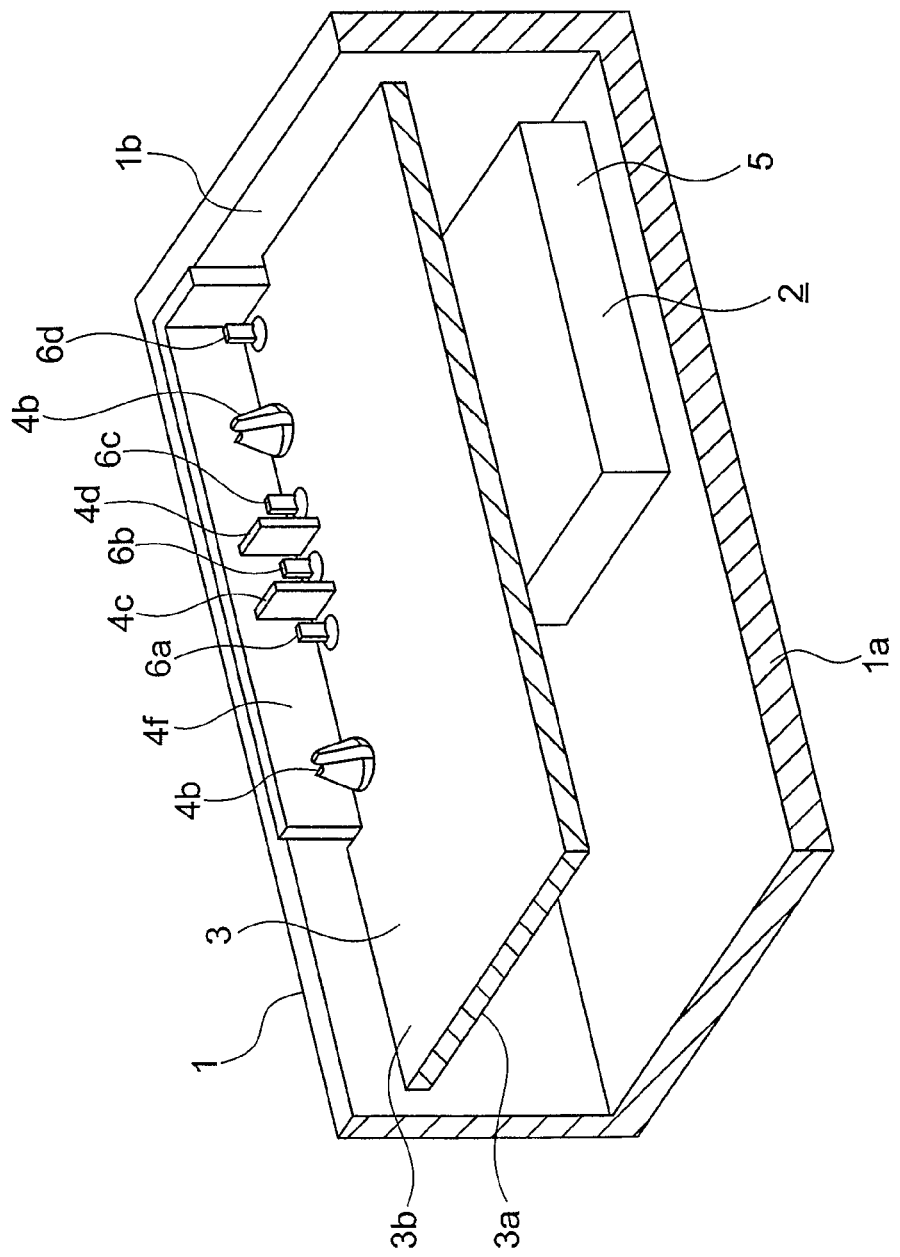
FIG. 8 is an oblique projection that shows part of the electronic device in FIG. 5.

Next, FIG. 5 is a plan that shows part of an electronic device according to Embodiment 2. FIG. 6 is a cross section that is taken along Line VI-VI in FIG. 5. FIG. 7 is a cross section that is taken along Line VII-VII in FIG. 5. FIG. 8 is an oblique projection that shows part of the electronic device in FIG. 5.

An insulating member 4 includes: a base portion 4a; a plurality of mounting portions 4b; a first lead interval insulating wall 4c; a second lead interval insulating wall 4d; and an outer insulating wall 4f that functions as an insulating wall.

The outer insulating wall 4f is disposed on two sides of the base portion 4a, namely, two sides that face side wall portion 1b. Because of that, as shown in FIG. 5, when viewed along a direction that is perpendicular to a first surface 3a and a second surface 3b, a shape of the outer insulating wall 4f is an L shape.

The outer insulating wall 4f is disposed between a plurality of lead terminals 6a, 6b, 6c, and 6d that each function as a first lead terminal, and the side wall portion 1b, which functions as a conductive member. The outer insulating wall 4f increases electrical insulation between the plurality of lead terminals 6a, 6b, 6c, and 6d and the side wall portion 1b.

The outer insulating wall 4f includes a first portion 10a and a second portion 10b. The first portion 10a protrudes from the base portion 4a on an opposite side from the circuit board 3.

The second portion 10b protrudes from the base portion 4a toward the circuit board 3 so as to be aligned with the first portion 10a. The circuit board 3 is partially cut away in order to allow the second portion 10b to protrude away from the bottom plate portion 1a relative to the second surface 3b.

An end portion of the first portion 10a at an opposite end from the base portion 4a is positioned closer to the bottom plate portion 1a than respective leader portions 7a. The amount of protrusion of the second portion 10b from the second surface 3b is greater than the amount of protrusion of respective extended portions 7b from the second surface 3b. Configuration of the electronic device is similar or identical to that of Embodiment 1, except for the outer insulating wall 4f.

According to an electronic device and insulating member 4 of this kind, similar or identical effects to those in Embodiment 1 can also be achieved. Furthermore, an outer insulating wall 4f is disposed on a base portion 4a in addition to a first lead interval insulating wall 4c and a second lead interval insulating wall 4d. Because of that, the occurrence of leakage currents between the plurality of lead terminals 6a, 6b, 6c, and 6d and the side wall portion 1b can be suppressed.

Embodiment 3

Figure 9:
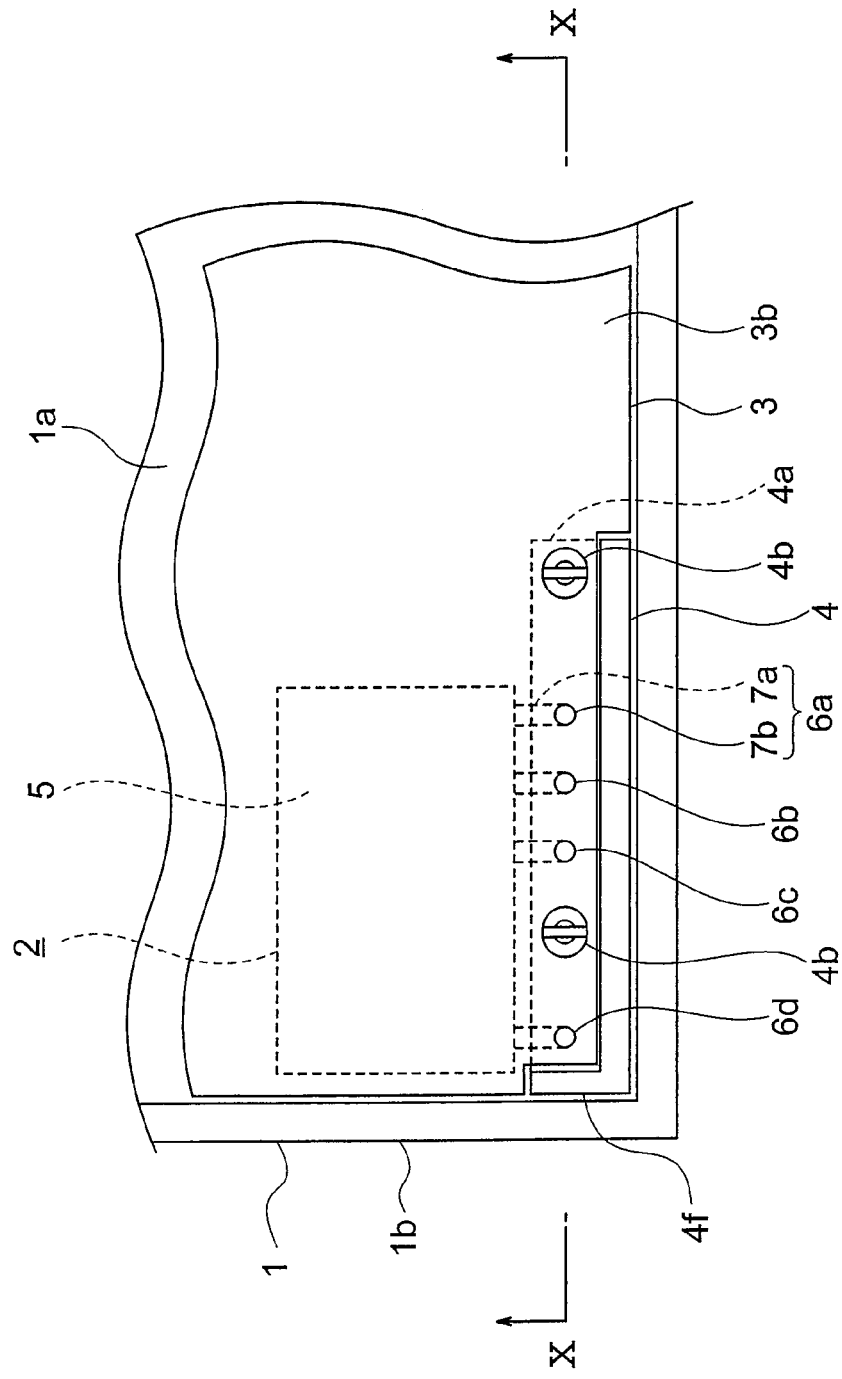
FIG. 9 is a plan that shows part of an electronic device according to Embodiment 3.
Figure 10:
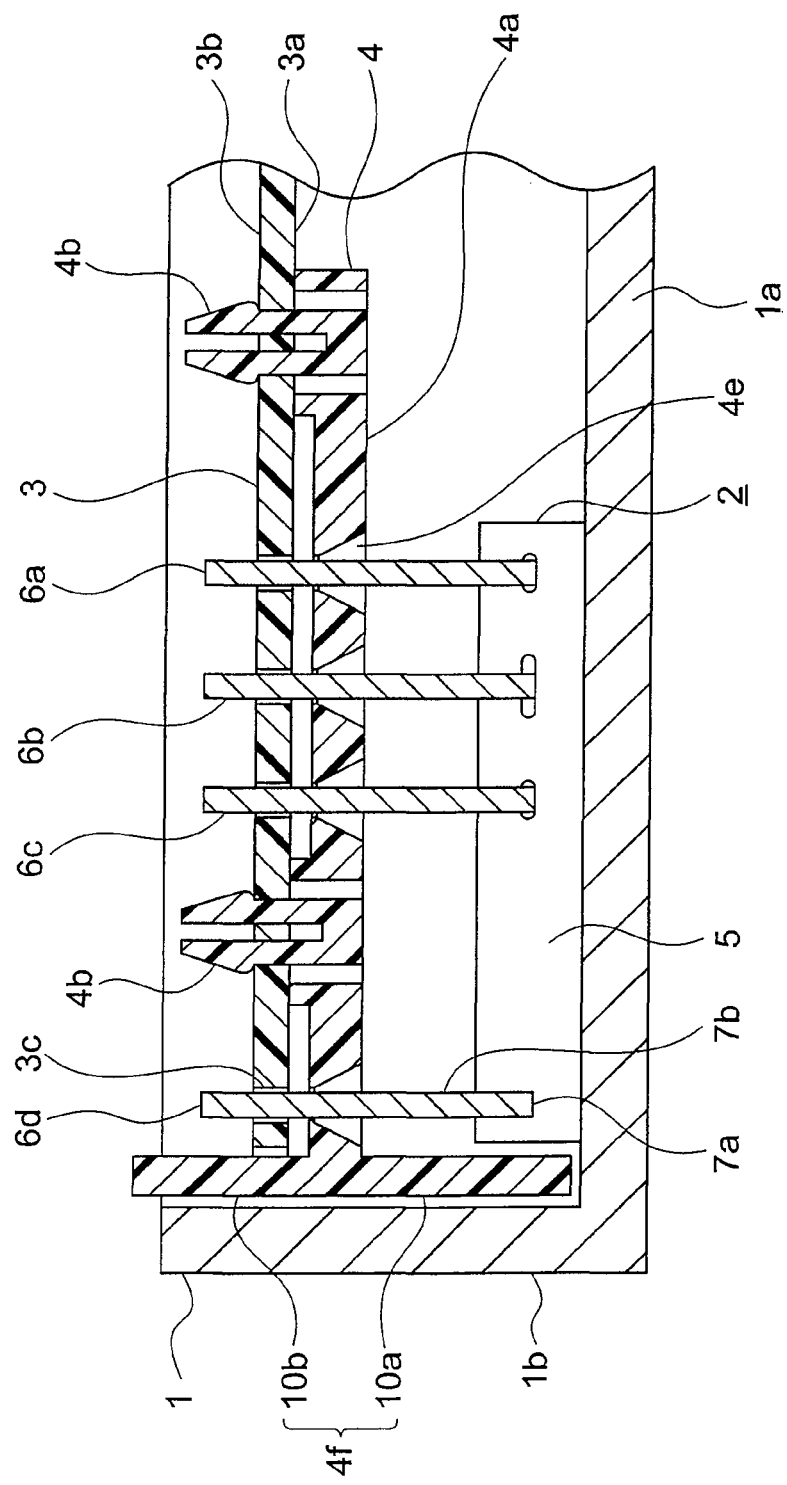
FIG. 10 is a cross section that is taken along Line X-X in FIG. 9.

Next, FIG. 9 is a plan that shows part of an electronic device according to Embodiment 3. FIG. 10 is a cross section that is taken along Line X-X in FIG. 9.

In Embodiment 3, the first lead interval insulating wall 4c and the second lead interval insulating wall 4d in the insulating member 4 according to Embodiment 2 are omitted. Configuration of a remainder of the electronic device is similar or identical to that of Embodiment 2.

According to an electronic device and insulating member 4 of this kind, the occurrence of leakage currents between the plurality of lead terminals 6a, 6b, 6c, and 6d and the side wall portion 1b can be suppressed. Furthermore, the configuration of the insulating member 4 can be simplified compared to Embodiment 2.

Moreover, electrically conductive members that are positioned adjacent to the first lead terminal are not limited to the second lead terminal and the side wall portion. The electrically conductive members may alternatively be lead terminals of other electronic components, busbars, or shielding plates, for example.

The base portion may alternatively be disposed in a space that is adjacent to the first surface.

The base portion may alternatively contact the circuit board.

The mounting portions are not limited to a particular number.

The mounting portions are not limited to snap fittings. The mounting portions may alternatively be press-fitted portions or crimped portions, for example.

Furthermore, the insulating member may alternatively not also serve as a guiding member for the lead terminals.

Connection portions between the lead terminals in the circuit board are not limited to through-holes.

What is claimed is:

1. An electronic device comprising:
   a circuit board;
   an electronic component comprising:
      a component main body that faces the circuit board; and
      a plurality of lead terminals that are connected to the circuit board and disposed adjacent to each other; and
   an insulating member that is mounted to the circuit board,
   wherein the insulating member comprises:
      a base portion comprising a first surface facing the circuit board and a second surface opposing the first surface and facing the component main body;
      a mounting portion that is disposed on the base portion, the mounting portion being mounted to the circuit board; and
      an insulating wall comprising portions,
   wherein each of the portions respectively protrudes in opposing directions from the first surface and the second surface of the base portion, and
   wherein each of the portions is disposed between each two individual adjacent lead terminals connected to the component main body among the plurality of lead terminals, respectively, and penetrates through the circuit board.

2. The electronic device according to claim 1, wherein:
   the circuit board comprises a facing surface that faces the component main body; and
   the base portion is disposed in a space that is adjacent to the facing surface.

3. The electronic device according to claim 1, further comprising:
   a housing that accommodates the circuit board, the electronic component, and the insulating member,
   the housing comprising:
      a bottom plate portion that faces the circuit board; and
      a side wall portion that functions as an electrically conductive member,
   wherein the insulating member further comprises an outer insulating wall disposed between one of the plurality of lead terminals and the side wall portion.

4. The electronic device according to claim 2, wherein each of the portions of the insulating wall comprises a first part that protrudes from the first surface of the base portion.

5. The electronic device according to claim 2, wherein a guiding aperture that guides a first lead terminal, among the plurality of lead terminals, during mounting of the electronic component to the circuit board is disposed on the base portion.

6. The electronic device according to claim 4, wherein each of the portions of the insulating wall further comprises a second part that protrudes from the second surface the base portion and is aligned with the first part.

7. An electronic device insulating member comprising:
   a base portion comprising a first surface to face a circuit board and a second surface opposing the first surface so as to face a main body of an electronic component mounted to the circuit board;

a mounting portion that is disposed on the base portion and mounted to the circuit board; and an insulating wall comprising portions, wherein each of the portions respectively protrudes in opposing directions from the first surface and the second surface of the base portion, and is disposed between each two adjacent lead terminals among a plurality of adjacently disposed lead terminals of the electronic component, respectively, and wherein each of the portions of the insulating wall comprises a first part that protrudes from the first surface of the base portion and penetrates through the circuit board, and a second part that protrudes from the second surface of the base portion and is aligned with the first part.

8. An electronic device comprising:

a circuit board;

an electronic component comprising:
 a component main body that faces the circuit board; and
 a plurality of lead terminals that are connected to the circuit board and disposed adjacent to each other; and
 an insulating member that is mounted to the circuit board, wherein the insulating member comprises:
 a base portion comprising a first surface facing the circuit board and a second surface opposing the first surface and facing the component main body;
 a mounting portion that is disposed on the base portion, the mounting portion being mounted to the circuit board; and
 an insulating wall comprising portions, wherein each of the portions respectively protrudes in opposing directions from the first surface and the second surface of the base portion, and is disposed between each two adjacent lead terminals among the plurality of lead terminals, respectively, wherein the circuit board comprises a facing surface that faces the component main body, wherein the base portion is disposed in a space that is adjacent to the facing surface, with the first surface facing the facing surface, and wherein each of the portions of the insulating wall comprises a first part that protrudes from the first surface of the base portion and penetrates through the circuit board, and a second part that protrudes from the second surface of the base portion toward the component main body and is aligned with the first part.

* * * * *